US008518736B2

(12) United States Patent
Wang et al.

(10) Patent No.: US 8,518,736 B2
(45) Date of Patent: Aug. 27, 2013

(54) GROWTH AND TRANSFER OF MONOLITHIC HORIZONTAL NANOWIRE SUPERSTRUCTURES ONTO FLEXIBLE SUBSTRATES

(75) Inventors: Zhong L. Wang, Marietta, GA (US); Sheng Xu, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 439 days.

(21) Appl. No.: 12/980,666

(22) Filed: Dec. 29, 2010

(65) Prior Publication Data
US 2012/0168710 A1 Jul. 5, 2012

(51) Int. Cl.
*H01L 21/00* (2006.01)
(52) U.S. Cl.
USPC .............................. 438/85; 438/104
(58) Field of Classification Search
USPC ................. 438/85, 86, 104, E29.168
See application file for complete search history.

(56) References Cited

U.S. PATENT DOCUMENTS

| 6,586,095 | B2 | 7/2003 | Wang et al. | |
|---|---|---|---|---|
| 7,220,310 | B2 | 5/2007 | Wang et al. | |
| 7,351,607 | B2 | 4/2008 | Wang et al. | |
| 7,705,523 | B2 | 4/2010 | Wang et al. | |
| 7,898,156 | B2 | 3/2011 | Wang et al. | |
| 8,399,339 | B2 * | 3/2013 | Lieber et al. | 438/478 |
| 8,415,240 | B1 * | 4/2013 | Odom et al. | 438/584 |
| 8,435,842 | B2 * | 5/2013 | Hirano et al. | 438/158 |
| 2003/0205657 | A1 | 11/2003 | Voisin | |
| 2004/0127025 | A1 | 7/2004 | Crocker, Jr. et al. | |
| 2005/0188751 | A1 | 9/2005 | Puskas | |
| 2005/0242366 | A1 | 11/2005 | Parikh et al. | |
| 2008/0067618 | A1 | 3/2008 | Wang et al. | |
| 2009/0066195 | A1 | 3/2009 | Wang et al. | |
| 2009/0115293 | A1 | 5/2009 | Wang et al. | |
| 2009/0179523 | A1 | 7/2009 | Wang et al. | |
| 2009/0209303 | A1 | 8/2009 | Kroll et al. | |
| 2010/0026142 | A1 | 2/2010 | Jones et al. | |
| 2010/0117488 | A1 | 5/2010 | Wang et al. | |
| 2010/0147371 | A1 | 6/2010 | Cho | |
| 2010/0191153 | A1 | 7/2010 | Sanders et al. | |

OTHER PUBLICATIONS

Jeon et al., "MEMS power generator with transverse mode thin film PCT," Science Direct, vol. 122, Issue 1, Jul. 29, 2005, pp. 16-22.

(Continued)

*Primary Examiner* — Cuong Q Nguyen
(74) *Attorney, Agent, or Firm* — Bryan W. Bockhop; Bockhop & Associates, LLC

(57) ABSTRACT

In a method of making a monolithic elongated nanowire, a mask polymer layer is applied to a selected crystal surface of a seed crystal. A plurality of spaced apart elongated openings is defined through the mask polymer layer, thereby exposing a corresponding plurality of portions of the crystal surface. The openings are disposed so as to be aligned with and parallel to a selected crystal axis of the seed crystal. The portions of the crystal surface are subjected to a chemical nutrient environment that causes crystalline material to grow from the plurality of portions for at least a period of time so that monocrystalline members grow from the elongated openings and until the monocrystalline members laterally expand so that each monocrystalline member grows into and merges with an adjacent one of the monocrystalline members, thereby forming a monolithic elongated nanowire.

15 Claims, 4 Drawing Sheets

(56) References Cited

OTHER PUBLICATIONS

Gao et al., Nanoarchitectures of semiconducting and piezoelectric zinc oxide, J. Applied Physics 97, 044304 (2005).

Wang et al., "Large-Size Liftable Inverted-Nanobowl Sheets as Reusable Masks for Nanolithography," Nano Letters, vol. 5, No. 9, 2005, 1748-1788.

Lao et al., "Formation of double-side teethed nanocombs of ZnO and self-catalysis of Zn-terminated polar surface," Chemical Physics Letters, Elsevier B.V., 2005.

Jeon et al., "MEMS power generator with transverse mode thin film PZT," Sensors and Actuators A Physical, Elsevier, (2005).

Lao et al., "Formation of double-side teethed nanocombs of ZnO and self-calalysis of Zn-terminated polar surface," Chemical Physics Letters (Science Direct), (Abstract), 2007.

Wang et al., "Large-Size Liftable Inverted-Nanobowl Sheets as REusable Masks for Nanolithography," Nano Letters, vol. 5, (Abstract), 2005.

Wang et al., "Piezoelectric Nanogenerators Based on Zinc Oxide Nanowire Arrays," Science, vol. 312, pp. 242-245, Apr. 14, 2006.

Peck-Radosavjevic et al., "Thrombopoietin induces rapid resolution of thrombocytopenia after orthotopic liver transplantation through increased platelet production," Blood, vol. 95, No. 3, (2000).

Xu et al., "Patterned Growth of Horizontal ZnO Nanowire Arrays," J. Sm. Chem. Soc., 2009, vol. 131, No. 19, pp. 6670-6671.

\* cited by examiner

GROWTH AND TRANSFER OF MONOLITHIC HORIZONTAL NANOWIRE SUPERSTRUCTURES ONTO FLEXIBLE SUBSTRATES

STATEMENT OF GOVERNMENT INTEREST

This invention was made with government support under contract No. Department of Energy, awarded by the DE-FG02-07ER46394. The government has certain rights in the invention.

BACKGROUND OF THE INVENTION

1. Field of the Invention

The present invention relates to nanostructures and, more specifically, to a method for making elongated nanostructures.

2. Description of the Related Art

Zinc oxide (ZnO) is a piezoelectric material that has a direct wide band gap of 3.37 eV and a large excitation binding energy of 60 meV. It has been used in a variety of applications, including: electronic, optoelectronic, electrochemical, and electromechanical nanodevices, such as ultraviolet (UV) lasers, light-emitting diodes, field emission devices, solar cells, high performance nanosensors, piezoelectric nanogenerators, and nano-piezotronics. ZnO nanowires (NWs) have been synthesized by a wide range of approaches, such as physical vapor deposition, wet chemical method, pulsed laser deposition, metal-organic chemical vapor deposition, molecular beam epitaxy, etc. By controlling the synthesis parameters, a control has been demonstrated on their morphology, dimensionality, crystallinity, and aspect ratio of the ZnO NWs.

Typically, most ZnO nanowires have been formed as freely floating inside the solution body and entangled with each other. In order to integrate the ZnO NWs into functional nanodevices, a seeded growth method has been used to grow vertically aligned ZnO NW arrays by coating a substrate with a ZnO seed thin film prior to wet chemical growth. However, the ZnO seed film was polycrystalline in nature and the vertical alignment of the seeded grown ZnO NW arrays was rather poor. By employing an epitaxial relationship on monocrystalline substrates, almost perfectly vertically aligned ZnO NW arrays were grown on GaN, AlGaN, SiC, $Al_2O_3$, and $MgAl_2O_4$ substrates. In an effort to arrange the ZnO NWs into a more regular form to further enhance the performance of the nanodevices, the positions of the ZnO NWs on the substrate have been controlled by a variety of techniques, including photolithography, nano-sphere lithography, nano-imprint lithography and electron beam lithography.

Horizontally-grown ZnO NWs may have many potential applications. In growing such horizontal nanowires, instead of coating a top surface of the substrate, ZnO seed thin films are coated on the sidewalls of the trenches on the substrate so that the ZnO NWs are able to grow parallel to the substrate surface. However, the aligned ZnO NWs tend to be sparse and exhibit poor horizontal alignment. Horizontally aligned ZnO NW arrays can also be made on the top surface a substrate by controlling the surface texture of the as deposited polycrystalline ZnO seed film with pulsed laser deposition. Epitaxial growth of horizontal ZnO NW arrays on an a-plane sapphire substrate by physical vapor deposition has been attempted, but the method lacked uniformity and spatial control of the horizontal ZnO NWs. Horizontal alignment of ZnO NWs after growth has also been demonstrated by dispersing and floating the NWs in a solvent and then applying high frequency alternating electrical field. However, existing methods have had difficulty growing long horizontal nanowires.

Also, many potential applications of horizontally-grown nanowires require placement of the nanowires on a flexible substrate. However, existing methods of placement can be impractical.

Therefore, there is a need for a method for growing long horizontal nanowires and embedding them in a flexible substrate.

SUMMARY OF THE INVENTION

The disadvantages of the prior art are overcome by the present invention which, in one aspect, is a method of making a monolithic elongated nanowire, in which a mask polymer layer is applied to a selected crystal surface of a seed crystal. A plurality of spaced apart elongated openings is defined through the mask polymer layer, thereby exposing a corresponding plurality of portions of the crystal surface. The openings are disposed so as to be aligned with and parallel to a selected crystal axis of the seed crystal. The portions of the crystal surface are subjected to a chemical nutrient environment that causes crystalline material to grow from the plurality of portions for at least a period of time so that monocrystalline members grow from the elongated openings and until the monocrystalline members laterally expand so that each monocrystalline member grows into and merges with an adjacent one of the monocrystalline members, thereby forming a monolithic elongated nanowire.

In another aspect, the invention is a method of making an encapsulated nanostructure, in which a mask polymer layer is applied to a selected crystal surface of a seed crystal. At least one opening is defined through the mask polymer layer, thereby exposing a portion of the crystal surface. The portion of the crystal surface is subjected to a chemical nutrient environment that causes crystalline material to grow from the portion, thereby forming a monolithic elongated nanostructure. A pre-polymer is applied to the nanostructure and to the mask polymer layer. The pre-polymer is allowed to polymerize, thereby forming a flexible substrate that encapsulates the nanostructure with the mask polymer layer. The flexible substrate is peeled away from the selected crystal surface of the seed crystal with the nanostructure embedded therein.

In yet another aspect, the invention is a device that includes a flexible polymer substrate and an elongated nanostructure disposed in the flexible polymer substrate.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1A:
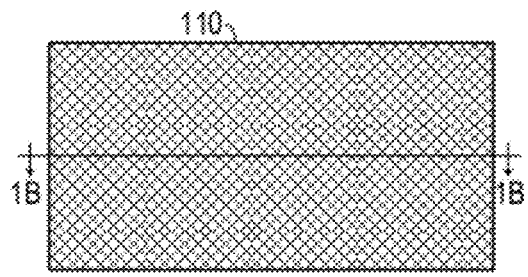
FIGS. 1A-1I are several schematic drawings showing a method of making a monolithic elongated nanowire.
Figure 1B:
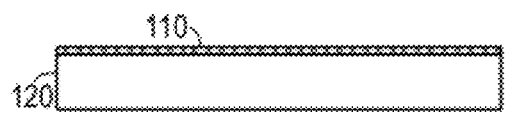
Figure 1C:
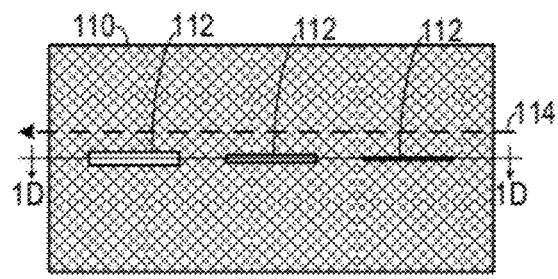
Figure 1D:
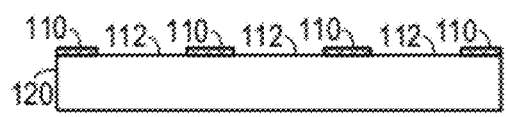
Figure 1E:
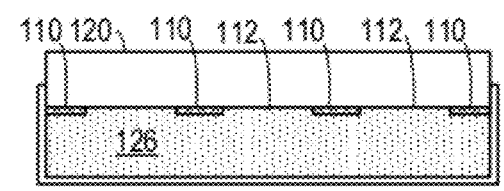
Figure 1F:
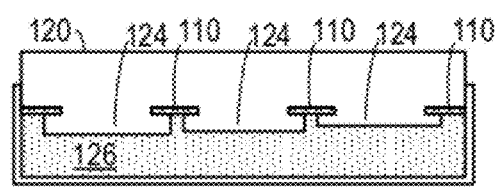
Figure 1G:
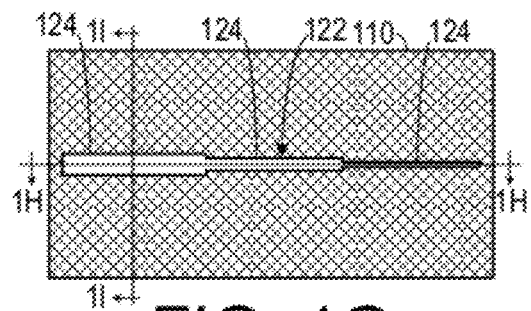
Figure 1H:
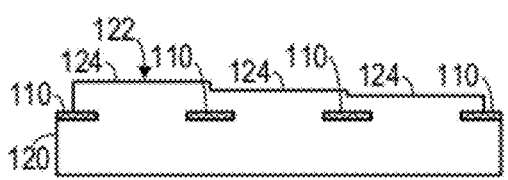
Figure 1I:
Figure 2A:
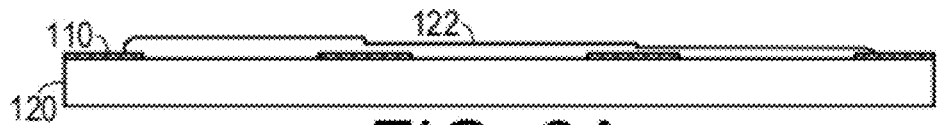
FIGS. 2A-2F are several schematic drawings showing a method of securing a nanowire to a flexible substrate.
Figure 2B:
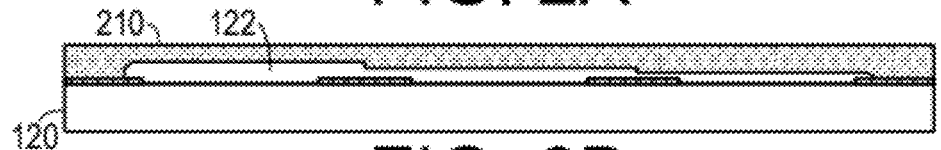
Figure 2C:
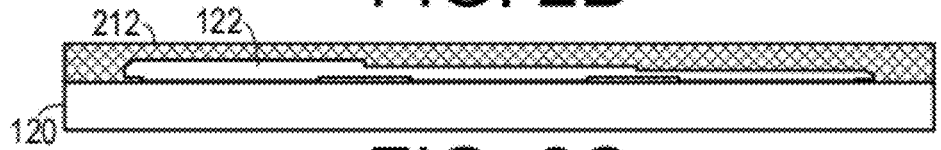
Figure 2D:
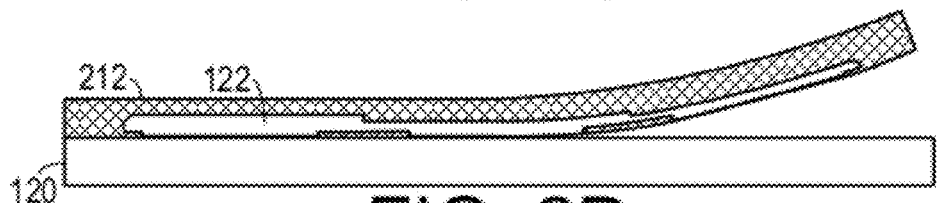
Figure 2E:
Figure 2F:
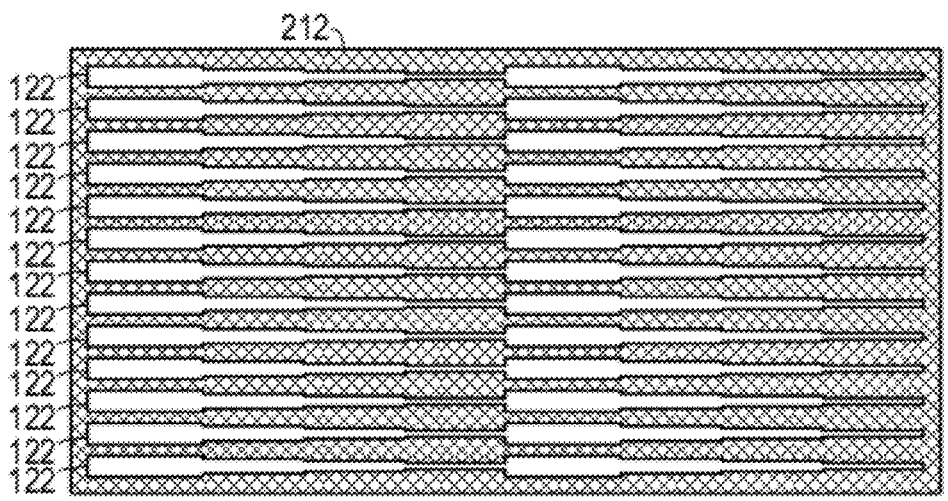

A preferred embodiment of the invention is now described in detail. Referring to the drawings, like numbers indicate like parts throughout the views. Unless otherwise specifically indicated in the disclosure that follows, the drawings are not necessarily drawn to scale. As used in the description herein and throughout the claims, the following terms take the meanings explicitly associated herein, unless the context clearly dictates otherwise: the meaning of "a," "an," and "the" includes plural reference, the meaning of "in" includes "in" and "on."

The following U.S. patent applications disclose methods of generating zinc oxide piezoelectric nanostructures of the types disclosed below and are hereby incorporated by reference: Ser. No. 10/726,016, filed on Dec. 2, 2003 by Wang et al., Ser. No. 11/608,865, filed on Dec. 11, 2006 by Wang et al., Ser. No. 11/760,002, filed on Jun. 8, 2007 by Wang et al., Ser. No. 12/209,310, filed on Sep. 12, 2008 by Wang et al., and Ser. No. 12/413,470, filed on Mar. 27, 2009 by Wang et al. U.S. Pat. No. 6,586,095 issued on Jul. 1, 2003 to Wang et al. also discloses methods of generating piezoelectric nanostructures and is hereby incorporated by reference.

As shown in FIGS. 1A-1G, in one embodiment of a method of making an elongated nanowire 122, a mask polymer layer 110, such as poly(methyl methacrylate) (PMMA), is applied to a selected face of a monocrystalline seed crystal 120, such as a zinc oxide (ZnO) crystal. (In one embodiment, the selected face includes a selected one of a ($2\bar{1}\bar{1}0$) surface or a ($01\bar{1}0$) surface.) A plurality of elongated openings 112 is defined in the mask polymer layer 110, thereby exposing portions of the surface of the monocrystalline seed crystal 120. The openings 112 are aligned with and parallel to a selected crystal axis 114 of the seed crystal 120. The openings 112 are subjected to a chemical nutrient environment 126 that causes crystalline material to grow from the seed crystal 120 into a plurality of monocrystalline members 124. After a predetermined amount of time, the monocrystalline members 124 will grow into each other to form a monolithic elongated nanowire 122.

In one embodiment, the single crystal ZnO ($2\bar{1}\bar{1}0$) substrate 120 (which in one experimental embodiment was purchased from MTI Corporation, 860 South 19th Street, Richmond, Calif. 94804, US) was initially cleaned by a standard cleaning process, in which the wafer was ultrasonicated consecutively in acetone, ethanol, IPA (isopropyl alcohol) and de-ionized water each for 10 minutes, then blew dry by nitrogen gas.

Then the substrate 120 was spun coated with a 50 nm thick layer of PMMA 110 (available from MicroChem Corp., 90 Oak St., Newton, Mass. 02464), at a speed of 6000 rotations per minute for 60 seconds. Then, the monocrystalline substrate 120 was baked on a hotplate at 180° C. for 120 seconds. After that, a conductive organic film (ESPACER, also available from MicroChem. Corp.) (not shown) was applied to the top of the PMMA layer 110 to avoid charge accumulation from incoming electrons on the substrate 120.

In one embodiment, the openings were made using known electron beam lithographic techniques. The line dose used ranged from 2.35 nC/cm to 2.55 nC/cm for the thinner openings 112, and from 260 µC/cm$^2$ to 360 µC/cm$^2$ for the wider openings 112. After the electron beam exposure, the substrate 120 was first rinsed in de-ionized water for 1 min to remove the residual ESPACER; then it was developed in a mixture of 3:1 (in volume) of IPA (isopropyl alcohol) and MIBK (Methyl isobutyl ketone) for 2 minutes.

Figure 4A:
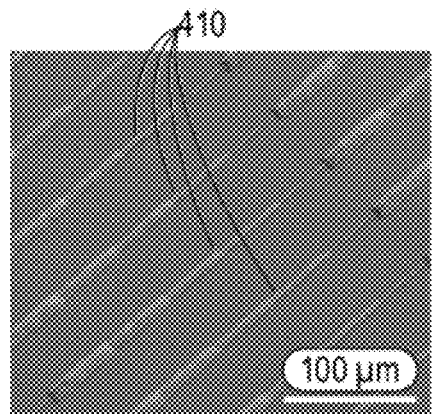
FIGS. 4A-4C are several micrographs of nanowires.
Figure 4B:
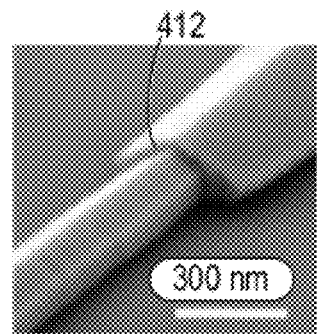

Then the substrate 120 was ready for hydrothermal crystal growth. The nutrient solution 126 used here was composed of 1:1 ratio of zinc nitrate hexahydrate and HMTA (hexamethylenetetramine). The patterned ZnO substrate 120 was put in the growth solution 126 facing down floating on the top surface of the nutrient solution 126 by virtue of surface tension of the nutrient solution 126. The whole system was maintained at a temperature of between 80° C. and 85° C. for 2.5 hours. After growth, the whole system was allowed to cool down to ambient temperature. Then the substrate 120 was removed from the nutrient solution 126 and immersed in IPA to remove any absorbed water. A resulting long horizontal nanowire 410 is shown in FIG. 4A and a detail of a junction 412 between two segments of a nanowire is shown in FIG. 4B.

Figure 4C:
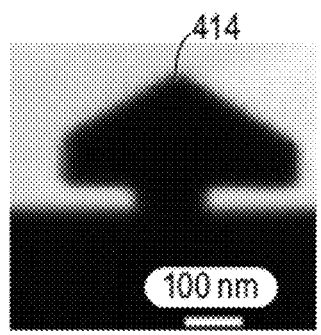

As shown in FIGS. 2A-2F, the nanowires 122 can be removed from the substrate 120 by initially applying a pre-polymer (such as methyl methacrylate) layer 210 to nanowire 122 and the mask polymer layer 110. The pre-polymer layer 210 is cured so that the pre-polymer polymerizes with the mask layer 110 to form a flexible substrate 212 that encapsulates the monolithic elongated nanowire 122. The flexible substrate 212 can then be peeled away from the surface of the seed crystal 120 with the nanowire 122 embedded therein. A side of the flexible substrate 212 can be oxygen plasma etched to expose a flat side of the elongated nanowire 122. The overgrowth of one segment is shown in FIG. 4C, which is a cross-sectional view of one segment 414.

Figure 5:
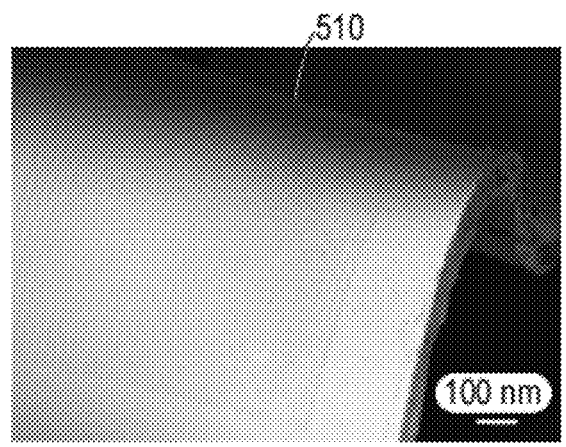
FIG. 5 is a micrograph of a plurality of nanowires secured to a flexible substrate.

In one experimental embodiment, the thin layer of PMMA prepolymer served for two purposes: First, it formed strong interface chemical bonds with the existing PMMA photoresist that allowed the lifting off of the nanowires; Second, it provided a flexible thin film substrate onto which the nanowires can be bent. In the experimental embodiment, the PMMA prepolymer was prepared by heating a methyl methacrylate (MMA) monomer with 0.1% benzoyl peroxide at 95° C. for 15 min and then cooling it to room temperature. After that, the sample was kept at 50° C. for 10 hours and 100° C. for 1 hour to make the prepolymer fully polymerized. As a result of this, the ZnO nanowires were embedded in the PMMA. Next, the PMMA thin film was peeled away from the ZnO single crystal substrate so that the horizontal nanowires were transferred onto the PMMA thin film. Oxygen plasma was applied to the PMMA thin film to partially expose the buried NW arrays. The as-grown and transferred horizontal ZnO NW arrays 510 were characterized by scanning electron microscopy (SEM) at 5 kV and transmission electron microscopy (TEM) at 400 kV using a JEM 4000EX, as shown in FIG. 5.

Figure 3:
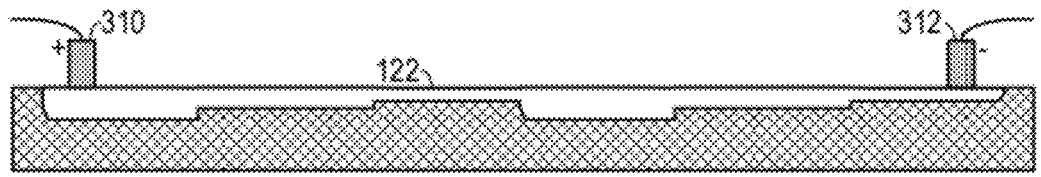
FIG. 3 is a schematic diagram of an encapsulated nanowire to which electrical contacts have been applied.

As shown in FIG. 3, a first electrical contact 310 can be applied to a first end of the elongated nanowire 122 and a second electrical contact 312 can be applied to a second end of the nanowire 122. The first electrical contact 310 and the second electrical contact 312 could include a material (such as indium) that forms an Ohmic contact with the nanowire 122, or they could include a material (such as gold) that forms a Schottky barrier with the nanowire 122. In one embodiment, the first electrical contact 310 could form an Ohmic contact, while the second electrical contact 312 could form a Schottky contact.

This method allows for growth of horizontal ZnO nanowire arrays with extensive control of their width and length. By designing the layout of the photoresist openings on the substrate, monolithic multi-segment superstructures by virtue of lateral overgrowth of the ZnO nanowires can be fabricated. Furthermore, by encapsulating the nanowire arrays with a polymer thin film, the horizontal nanowire arrays can be lifted off and transferred onto flexible substrates, which shows great promise for many applications based on horizontal ZnO NW arrays, including chemical and biological sensor arrays, light emitting diodes, optical gratings, integrated circuit interconnects, and high output power alternating current nanogenerators.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A method of making a monolithic elongated nanowire, comprising the steps of:
   a. applying a mask polymer layer to a selected crystal surface of a seed crystal;
   b. defining a plurality of spaced apart elongated openings through the mask polymer layer, thereby exposing a corresponding plurality of portions of the crystal surface, the openings disposed so as to be aligned with and parallel to a selected crystal axis of the seed crystal; and
   c. subjecting the portions of the crystal surface to a chemical nutrient environment that causes crystalline material to grow from the plurality of portions for at least a period of time so that monocrystalline members grow from the elongated openings and until the monocrystalline members laterally expand so that each monocrystalline member grows into and merges with an adjacent one of the monocrystalline members, thereby forming a monolithic elongated nanowire.

2. The method of claim 1, wherein the mask polymer layer comprises poly(methyl methacrylate).

3. The method of claim 1, wherein the seed crystal comprises a zinc oxide crystal.

4. The method of claim 3, wherein the selected crystal surface comprises a selected one of a (2 $\bar{1}$ $\bar{1}$ 0) surface or a (0 $\bar{1}$ $\bar{1}$ 0) surface.

5. The method of claim 1, further comprising the steps of:
   a. applying a pre-polymer to the monolithic elongated nanowire and to the mask polymer layer;
   b. allowing the pre-polymer to polymerize, thereby forming with the mask polymer layer a flexible substrate that encapsulates the monolithic elongated nanowire; and
   c. peeling the flexible substrate away from the selected crystal surface of the seed crystal with the monolithic elongated nanowire embedded therein.

6. The method of claim 5, wherein the applying a pre-polymer step comprises applying methyl methacrylate.

7. The method of claim 5, further comprising the step of oxygen plasma etching a selected side of the flexible substrate thereby exposing a side of the monolithic elongated nanowire.

8. The method of claim 5, wherein the nanowire includes a first end and an opposite second end, the method further comprising the steps of:
   a. applying a first electrical contact to the first end; and
   b. applying a second electrical contact to the second end.

9. A method of making an encapsulated nanostructure, comprising the steps of:
   a. applying a mask polymer layer to a selected crystal surface of a seed crystal;
   b. defining at least one opening through the mask polymer layer, thereby exposing a portion of the crystal surface;
   c. subjecting the portion of the crystal surface to a chemical nutrient environment that causes crystalline material to grow from the portion, thereby forming a monolithic elongated nanostructure;
   d. applying a pre-polymer to the nanostructure and to the mask polymer layer;
   e. allowing the pre-polymer to polymerize, thereby forming a flexible substrate that encapsulates the nanostructure with the mask polymer layer; and
   f. peeling the flexible substrate away from the selected crystal surface of the seed crystal with the nanostructure embedded therein.

10. The method of claim 9, wherein the mask polymer layer comprises poly(methyl methacrylate).

11. The method of claim 9, wherein the seed crystal comprises a zinc oxide crystal.

12. The method of claim 11, wherein the selected crystal surface comprises a selected one of a (2 $\bar{1}$ $\bar{1}$ 0) surface or a (0 $\bar{1}$ $\bar{1}$ 0) surface.

13. The method of claim 9, wherein the applying a pre-polymer step comprises applying methyl methacrylate.

14. The method of claim 9, further comprising the step of oxygen plasma etching a selected side of the flexible substrate thereby exposing a side of the nanostructure.

15. The method of claim 9, wherein the nanostructure includes a first end and an opposite second end, the method further comprising the steps of:
   a. applying a first electrical contact to the first end; and
   b. applying a second electrical contact to the second end.

* * * * *